United States Patent
Chen et al.

(10) Patent No.: US 7,052,781 B2
(45) Date of Patent: May 30, 2006

(54) FLEXIBLE COPPER FOIL STRUCTURE AND FABRICATION METHOD THEREOF

(75) Inventors: Yu-Chung Chen, Hsinchu (TW); Hong-Kuen Lee, Hsinchu (KR)

(73) Assignee: Industrial Technology Research Institute, Hsinchu (TW)

( * ) Notice: Subject to any disclaimer, the term of this patent is extended or adjusted under 35 U.S.C. 154(b) by 77 days.

(21) Appl. No.: 10/843,032

(22) Filed: May 11, 2004

(65) Prior Publication Data

US 2005/0142374 A1 Jun. 30, 2005

(30) Foreign Application Priority Data

Dec. 26, 2003 (TW) .............................. 92137049 A

(51) Int. Cl.
  *B32B 15/04* (2006.01)
  *B32B 15/20* (2006.01)
  *C25D 3/38* (2006.01)
  *C25D 7/06* (2006.01)

(52) U.S. Cl. ...................... 428/674; 428/675; 428/607; 428/332; 205/239; 205/291

(58) Field of Classification Search ................ 428/674, 428/675, 687, 606, 607, 610, 220, 332, 676; 205/239, 291, 295, 296, 111
See application file for complete search history.

(56) References Cited

U.S. PATENT DOCUMENTS

| | | | | |
|---|---|---|---|---|
| 5,366,814 A | * | 11/1994 | Yamanishi et al. | 428/607 |
| 5,456,817 A | * | 10/1995 | Hino et al. | 205/125 |
| 5,545,466 A | * | 8/1996 | Saida et al. | 428/209 |
| 5,552,234 A | * | 9/1996 | Kawasumi | 428/633 |
| 5,989,727 A | * | 11/1999 | Yates et al. | 428/607 |
| 6,342,308 B1 | * | 1/2002 | Yates et al. | 428/607 |

* cited by examiner

*Primary Examiner*—Michael E. LaVilla
(74) *Attorney, Agent, or Firm*—Thomas, Kayden, Horstemeyer & Risley

(57) ABSTRACT

A new copper foil structure with enhanced flexibility and its fabrication method thereof are disclosed. This inventive structure includes a copper base foil having a matte side and shiny side, and a more thermally stable deposited layer overlying at least the matte side of the copper base foil.

13 Claims, 5 Drawing Sheets

FLEXIBLE COPPER FOIL STRUCTURE AND FABRICATION METHOD THEREOF

BACKGROUND OF THE INVENTION

1. Field of the Invention

This invention relates to a copper foil structure with enhanced flexibility for use in flexible printed circuit boards, and more specifically to a deposition method of forming a thermally stable layer overlying the matte side of a super-HTE (high temperature elongation) electrolytic copper foil.

2. Description of the Related Art

Flexible printed circuit boards are widely used for repetitive flex motion devices from office appliances such as printers and hard disk drives to telecommunication gadgets such as mobile phones, PDAs . . . etc., because of the superb fatigue performance thereof.

As copper is a conductive element, copper foils laminated on the FPC board must be conformal to fatigue. Two kinds of copper foil, electrolytic foil and rolled foil can be categorized by their respective manufacturing processes. Rolled and annealed copper foils, because of their superior fatigue performance, have been traditionally used in most FPC boards. High costs, direction-related properties and dimensional limitations (60 cm max in width), however, have impeded further development. On the other hand, conventional electrolytic copper foils made from high chloride concentration (>30 ppm) electrolyte generally have low fatigue ductility (20–50%). Accordingly, electrolytic copper foils can only be used for single bend usage items like dashboards or relatively large radius bends. However, the situation is currently changing now. A newly developed electrolytic copper foil has recently been realized and offers great improvement in high temperature elongation performance (>15%). This new copper foil is gradually gaining acceptance in the FPC field, as evidenced by its filing in the material code IPC-4562 (May, 2000), and also from the fact that other commercial rolled copper foil like M-BSH had been retired.

The structural characteristics of the electrolytic copper foil are very much dependent on processing conditions. Traditionally, the side directly contacting a cathode is known as the "shiny side", due to the fine grain size and a bright, smooth appearance thereof. Whereas the opposite side close to electrolyte is known as the "matte side", due to the rougher surface which is easily concurrent with the columnar grain structure contributed by the high chloride content. The matte side is often pink in color.

The flexible characteristics of copper foil are critical to their adaptation in FPC boards and is tested and reported on by the strain controlled fatigue tests. Unfortunately, there is still no universally accepted method up to now. The two most prevalent test methods are the bell-flex test specified in IPC-TM-650 and MIT folding endurance test filed as JIS-P-8115 or ASTM-D2176, popular in USA and Japan respectively. According to IPC-TM-650, the flex cycle number of the tested copper foil specimen must be limited in between 30–500 times by adjusting the mandrel diameter, and a Df (fatigue ductility) value can then be numerically analyzed. A larger Df value means a better flex performance for the tested specimen. On the other hand, with a fixed folding rate (175 cpm) and suitable assignment of load (e.g. 500 g) and radius of curvature of the bend faces (e.g. R=0.8 mm), the copper foil will be bend cyclically and then the bent cycles can be reached without failure will be recorded as Nf and directly used as performance index for the MIT test. As with the Df, a larger Nf also means a better folding performance.

Due to different methodologies and parameters used, the two different fatigue tests mentioned above can often result in conflicting conclusions for the same tested copper foil sample. Let's take the annealing effect on commercial SHTE electrolytic copper foil as an example. According to the inventors' discoveries, a 180° C.-60 min annealing treatment can indeed show advantageous effect on Dfs of copper foil as expected, but, on the contrary, will result in a detrimental effect on MIT-Nf. This inconsistency of annealing effect has puzzled the local FCCL and FPCB industries, which use the MIT test, and made the acceptance of electrolytic copper foil more difficult. Therefore, for making diversification more easy, all newly developed copper foil must face two challenges, that is (1) a better and more stable flex performance, and (2) a consistent advantageous annealing effect on flex performance must be guaranteed for both fatigue tests.

SUMMARY OF THE INVENTION

This invention relates to a new copper foil structure having superior flex performance for both kinds of fatigue tests simultaneously and the fabrication method thereof. By substituting a 2 µm thick thermally stable layer on at least the matte side surface of the substrate made from SHTE electrolytic copper foil, with a total thickness of 18 µm, this invention has proved that the substitution of the thermally stable layer can effectively enhance both the folding endurance life MIT-Nf and fatigue ductility Df from 212 times and 59.9% to 421 times and 98.2% for as-deposited status copper foils, and from 238 times and 74.9% to 450 times and 107% for 180° C.-60 min annealed status copper foil. In addition, this invention also relates to a process for fabricating the thermally stable layer with a fine grain structure by bright electroplating or other depositing methods capable of maintaining structural stability during annealing and/or flexing.

BRIEF DESCRIPTION OF THE DRAWINGS

This invention can be more fully understood by reading the subsequent detailed description with the examples and references given in the accompanying drawings, wherein.

DETAILED DESCRIPTION OF THE INVENTION

The following embodiments are intended to illustrate the invention more fully without limiting the scope of the claims, since numerous modifications and variations will be apparent to those skilled in this art.

Figure 1:
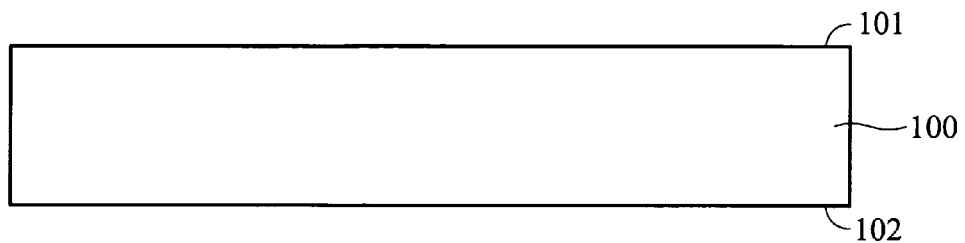
FIG. 1 is a cross-section of a copper base foil 100 comprising the enhanced flexible copper foil of the present invention.
Figure 5:
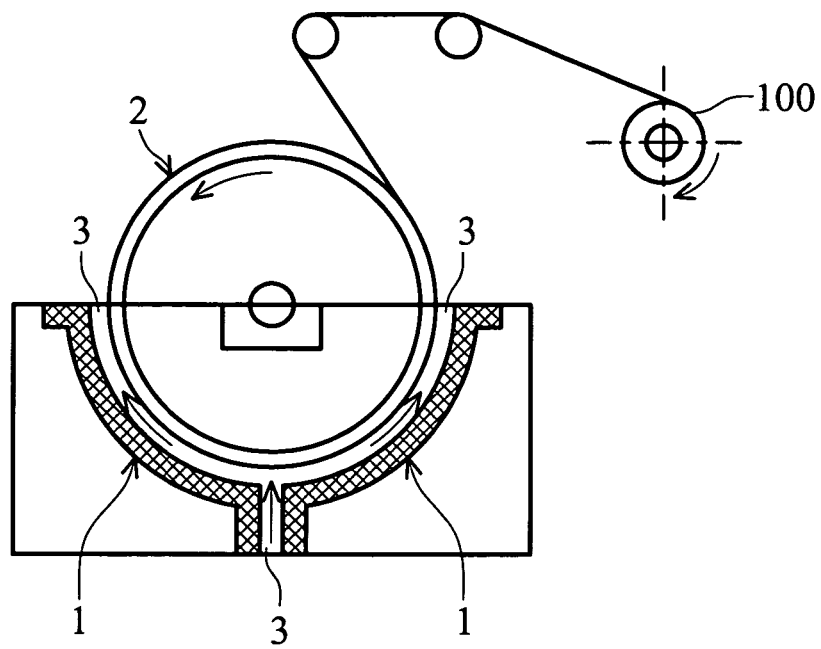
FIG. 5 is a cross-section of one example of the electrolytic copper foil fabrication apparatus as used to fabricate the base copper foil 100 of the present invention.

This inventive flexible copper foil structure contains a base foil 100 as shown in FIG. 1, which can be selected either from electrolytic or rolled copper foil. One example of an electrolytic copper foil fabrication apparatus is shown in FIG. 5, wherein "2" indicates a rotational, drum-shaped cathode made of SUS or titanium, "1" indicates an anode concentrically disposed outside cathode 2, and "3" indicates an electrolytic solution between the anode 1 and cathode 2, usually made of an aqueous solution of acidic copper sulfate. When a current flows through the anode 1 and cathode 2, copper atoms will be deposited on the surface of cathode 2, followed by the rotation of cathode 2 and a peeling off operation, a continuous copper foil can be formed. Generally, both surfaces of the electrolytic copper foil made as described above, show an obviously different appearance. Contributing to the formation of columnar grain, a rough and pink color appearance often results on the surface directly contacting the electrolytic solution 3 during formation, and is usually called the matte side 101. On the other hand, the opposite surface directly contacts cathode 2 during formation, always exhibits a fine grain microstructure and a brilliant, shiny appearance, and is referred to as the shiny side 102.

Figure 7:
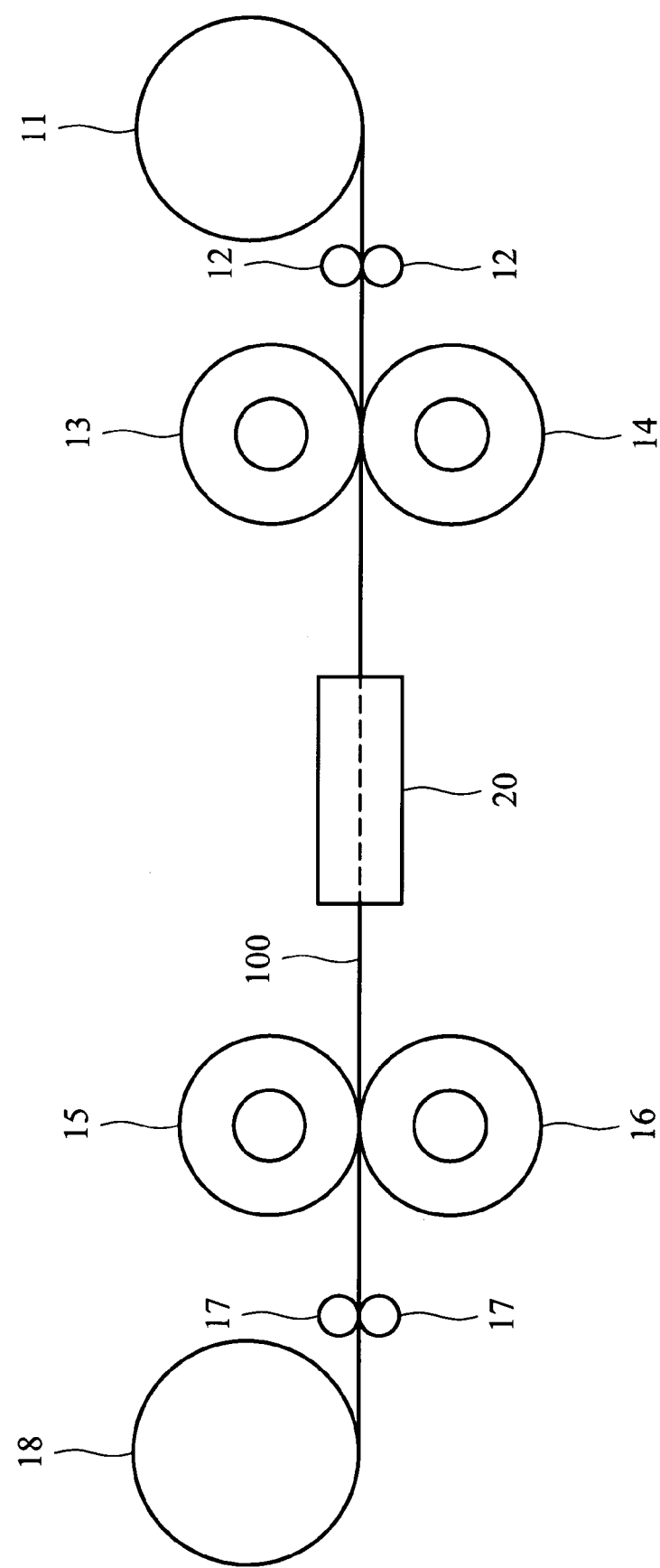
FIG. 7 is a cross-section of one example of the fabrication apparatus for rolling copper foil as used to fabricate the base copper foil 100 of the enhanced flexible copper foil structure of the present invention.

FIG. 7 is an example of a fabrication apparatus used for making rolling copper foil. Its operating procedure is described as follows. First, copper base foil 100 is disposed on the coiler 11. Then, copper base foil 100 is decoiled and flattened by coiling/decoiling roller 12. Next, the decoiled copper base foil 100 is cold-rolled by top roller 13 and bottom roller 14. Next, the strain-hardened copper base foil 100 is annealed by continuous annealing furnace 20. Further, the annealed copper base foil 100 is cold-rolled by top roller 15 and bottom roller 16. Finally, the copper base foil 100 is coiled on the coiler 18 using coiling/decoiling roller 17. The copper base foil 100 is rolled in reverse and obverse sequences reciprocally until a predetermined thickness been reached. The surface roughness of rolled copper base foil 100 depends on the surface of the rollers 13 through 16. For example, when top rollers 13 and 15 are rougher, the shiny side 102 is the side directly rolled by bottom rollers 14 and 16, and the other side is matte side 101.

Figure 2:
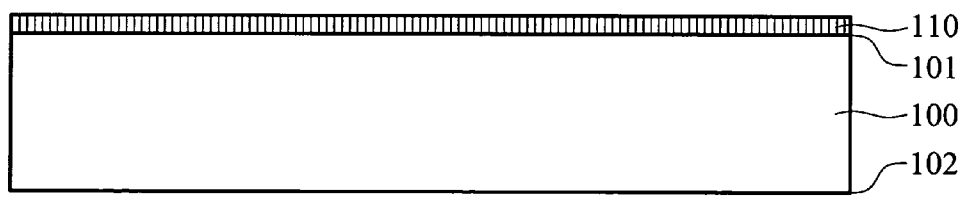
FIG. 2 is a cross-section of one example of the enhanced flexible copper foil of the present invention.
Figure 3:
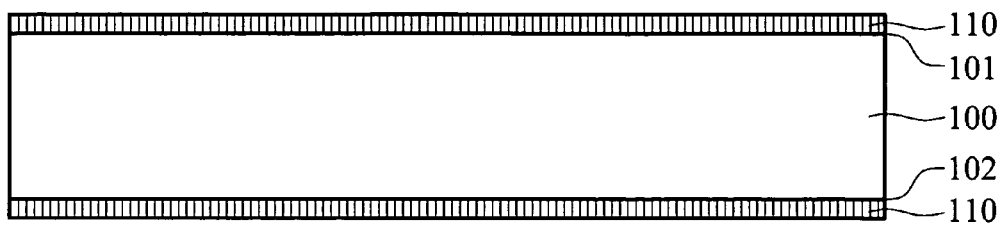
FIG. 3 is a cross-section of a second example of the enhanced flexible copper foil of the present invention.

In FIG. 2, a thermally stable layer 110 is formed overlying the matte side 101 of copper base foil 100. The thermally stable layer 110 can also be formed overlying both matte side 101 and shiny side 102 as shown in FIG. 3. By taking H—OZ copper foil as an example, the total structural thickness of FIG. 2 or FIG. 3 of the inventive copper foil is 18 μm in total, with preferred 1 to 3 μm thickness of base foil being substituted by thermally stable layer 110.

The inventive thermally stable layer 110 is a copper coating layer deposited by a different method from that used for forming copper base foil 100. By making the thermally stable layer 110 have a fine grain size of 2 μm or less, or contain more alloy elements, the deposition method, such as, bright copper electroplating, can make the surface modification layer have less sensitivity to an annealing treatment than its counter base foil 100, and finally a foil structure with a harder-face can be realized before and/or after the annealing treatment. Through this invention of overlying thermally stable layer on re-crystallization sensitive base copper foil, such as SHTE electrolytic copper foil or conventional rolled copper foil, degradation of tensile strength after an annealing treatment can be effectively reduced, and the fatigue performance can also be enhanced from ~200 to >400 folds for the MIT folding endurance test or from ~75% to >100% for IPC bell-flex test.

Figure 6:
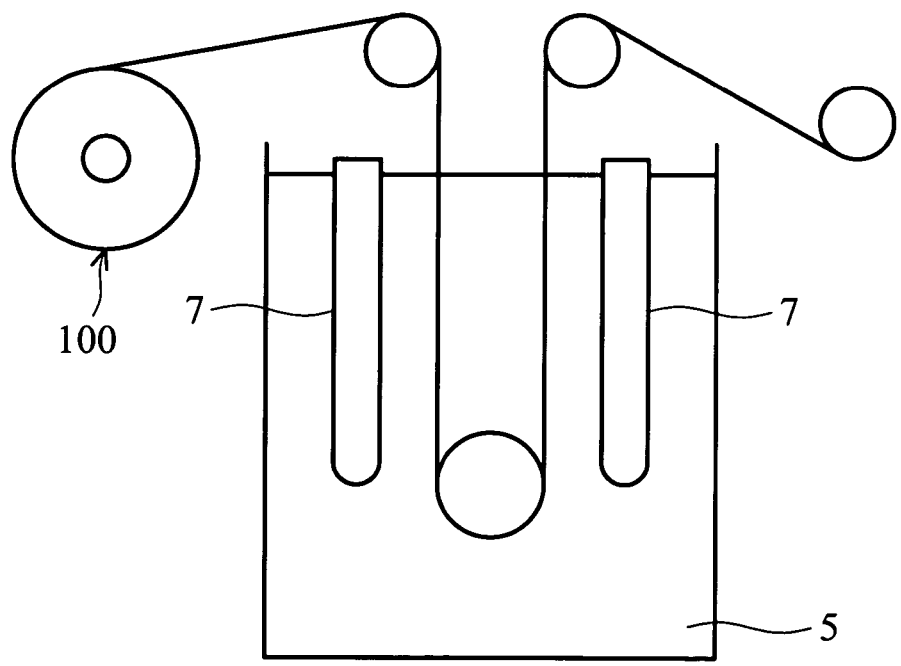
FIG. 6 is a cross-section of one example of the electroplating apparatus as used to form the thermally stable layer 110 of the enhanced flexible copper foil structure of the present invention.

In addition to the bright copper electroplating, the thermally stable layer 110 can also be formed by other copper deposition methods, such as, pulse electroplating or other physical or chemical methods, provided those methods are sufficient to form a copper coating layer 110 with a more thermally stable property than copper base foil 100. If electroplating methods are chosen for making the thermally stable layer 110, an electroplating apparatus shown in FIG. 6 can be used. In FIG. 6, the copper base foil 100 is received from the apparatus shown in FIG. 5, followed by immersion of the copper base foil 100 in the electrolytic solution 5 between the parallel anode plates 7. When the thermally stable layer 110 is formed by bright copper electroplating, additives which can refine the grain size of the thermally stable layer 110 and/or depress recrystallization sensitivity of the thermally stable layer 110 to a lesser degree than base copper foil, are added to the electrolytic solution 5 with copper sulfate and sulfuric acid as the main constituents, and then electroplating can be implemented by taking copper base foil 100 as a cathode and driving a current flow between the copper base foil 100 and parallel anode plates 7. On the other hand, if the thermally stable layer 110 is formed by pulse electroplating, a suitable pattern of pulse current for formation of fine grain size will flow through the copper base foil 100 and parallel anode plates 7 to form the thermally stable layer 110.

Figure 4:
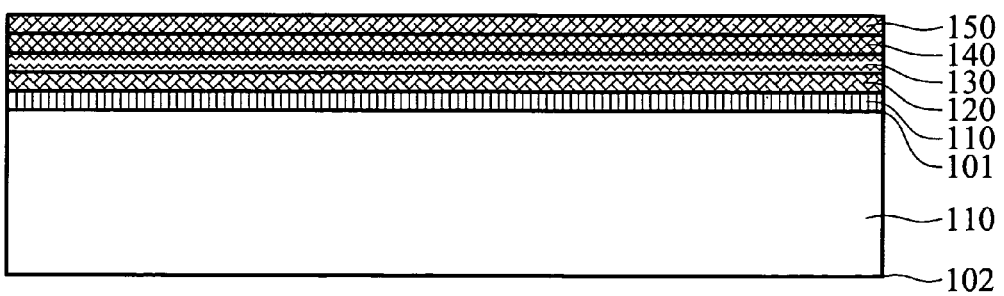
FIG. 4 is a cross-section of the enhanced flexible copper foil of the present invention after post-treatment.

After overlying the thermally stable layer 110 on copper base foil 110, conventional post-treatment procedures for nodulation layer, thermal barrier layer, anti-tarnishing layer and adhesion-promotion layer in the order as shown in FIG. 4, can then be sequentially implemented to enhance the adaptability of copper foil for use in flexible printed circuit boards.

In FIG. 4, a nodulation layer 120, is first formed overlying the thermally stable layer 110 to increase the contact area between the copper foil and the dielectric substrate material, thereby adhesion can be enhanced. A barrier layer 130, overlying the nodulation layer 120, formed by electroplating with Zn, Cu, Ni, Co, or combinations thereof, can prevent the copper atoms from migrating into dielectric material. Further, an anti-oxidation layer 140, deposited overlying the barrier layer 130, constituted by Zn, Cr, or a combination thereof can be helpful for the oxidation resistance of the copper foil of the present invention. Finally, a adhesion-promotion layer 150, such as silane or related derivatives thereof, is formed overlying the anti-oxidation layer 140 by dipping to further improve the adhesion between the enhanced flexible copper foil structure of the present invention and the dielectric material.

The results of the subsequent example and four comparative examples can further demonstrate the effectiveness of this invention.

EXAMPLE 1

A 16 μm thick SHTE electrolytic copper base foil 100 fabricated by Industrial Technology Research Institute (ITRI) was sampled. Next, a 2 μm thick thermally stable layer 110 was deposited overlying the matte side 101 of copper base foil 100 by bright copper electroplating with brightening agent 4110 produced by Advanced Chemical Inc. added in acidic copper sulfate electrolyte. Finally, the conventional post-treatment process for nodulation layer, barrier layer, anti-oxidation layer were sequentially deposited in the order as shown in FIG. 4. The test results of example 1 are listed in Table 1.

With the copper base foil 100 serve as a cathode and the DSA as an anode, the thermally stable layer 110, was formed in a cell of parallel electrodes in an electrolytic solution comprised of 75 g/L copper sulfate, 10% of sulfuric acid and 50 ppm of chloride ions with the temperature thereof maintained approximately 30° C. The current density employed was 2.5 A/dm$^2$. The feeding rate of brightening agent 4110 was 1 cc/10 Amp-min.

COMPARATIVE EXAMPLE 1

A 18 μm thick SHTE electrolytic copper base foil 100, fabricated by Industrial Technology Research Institute (ITRI) was sampled and treated with same post-treatments as example 1. The test results of the comparative example 1 are listed in Table 1.

COMPARATIVE EXAMPLE 2

A commercial 18 μm thick SHTE electrolytic copper foil without the thermally stable layer 110 was sampled for testing. The test results of the comparative example 2 are listed in Table 1.

COMPARATIVE EXAMPLE 3

A commercial 18 μm thick rolled copper foil RA1 without the thermally stable layer 110 was sampled along the rolling direction for testing. The test results of the comparative example 3 are listed in Table 1.

COMPARATIVE EXAMPLE 4

A commercial 18 μm thick rolled copper foil RA2 without the thermally stable layer 110 was sampled along the rolling direction for testing. The test results of the comparative example 4 are listed in Table 1.

Remarks

1. Thermal stability is the ratio of difference in tensile strength before (EA) and after (EH3) annealing treatment to the original tensile strength (EA). A lower thermal stability value indicates a lower re-crystallization sensitivity.
2. Test parameters selected for MIT tests were R=0.8 mm and loading=500 g.
3. IPC-Df is derived from the data tested with a mandrel diameter of 0.92 mm.
4. "EA" refers to a non-annealed status, and "EH3" refers to 180° C.-60 minutes annealed status.
5. "ED" refers to electrolytic copper foil, "RA" refers to rolled copper foil, and "P" refers to sampling along the rolling direction.

Results

As shown in Table 1, it is clear that example 1 with the inventive thermally stable layer structure did show obvious improvements in thermal stability performance, and in both the flex performances—MIT-Nf and IPC-Df among all the tested samples simultaneously. Wherein the most outstanding improvement is in MIT-Nf performance, not only experiencing a 200 folds increase, but also a highest MIT-Nf of 460 times for EH3 annealed status never before disclosed has been approved. By further comparing the conflicting annealing effect on flex performance occurring in commercial ED-SHTE (comparative example 2) for different fatigue testing methods, a consistent advantageous effect from annealing treatment indeed occurred in example 1.

Therefore, through this inventive copper foil structure, both the goals of this invention for improving MIT-Nf and overcoming the conflicting annealing effect can be achieved simultaneously.

Figure 8:
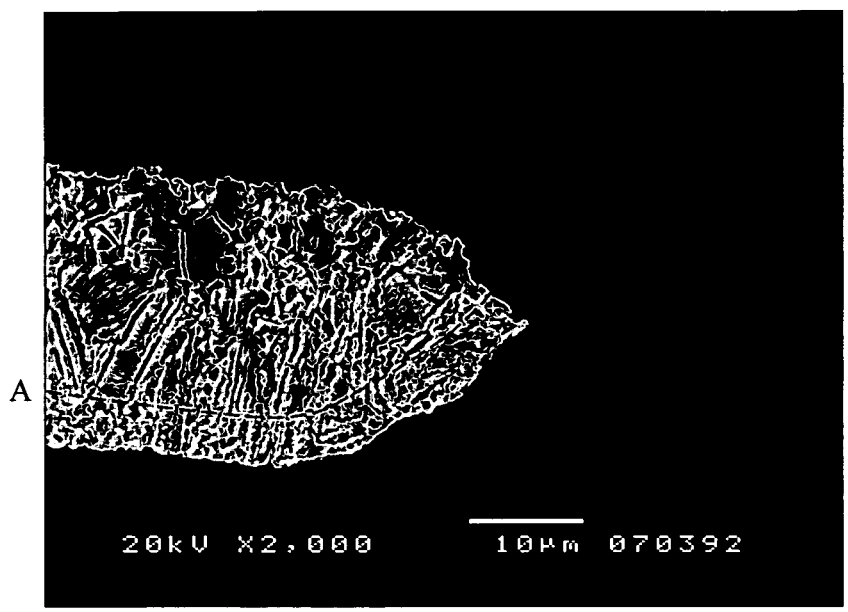
FIG. 8 is SEM cross-sectional micrograph of a post-annealed SHTE electrolytic copper foil specimen with the enhanced flexible copper foil structure of the present invention after the MIT folding endurance test.
Figure 9:
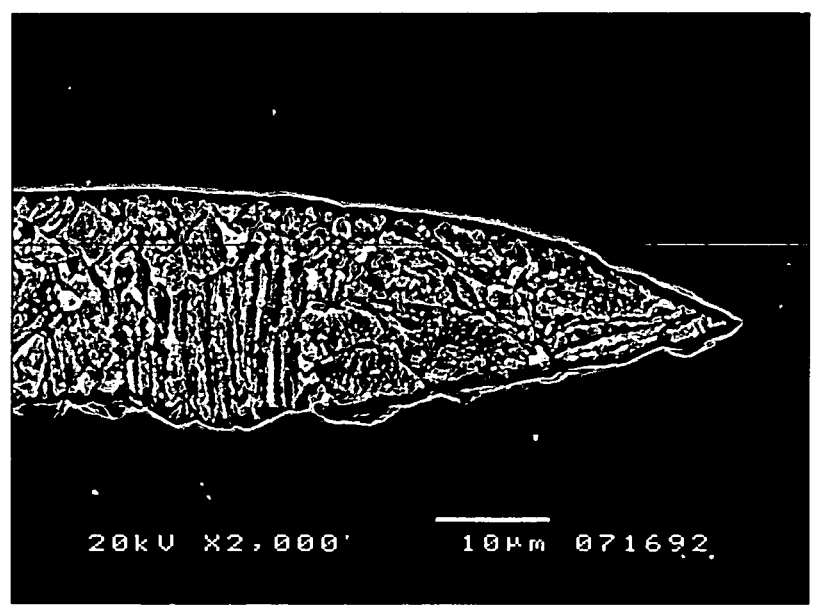
FIG. 9 is SEM cross-sectional micrograph of an as-deposited specimen of SHTE electrolytic copper foil after MIT folding endurance test.

Finally, the cross-sectional SEM micrograph of MIT-failed specimen for this invention and its counterpart of comparative example 1 are shown in FIGS. 8 and 9. In both figures, the ruptured regions shown in the right side after MIT test are exhibited, and with the matte side lying on the bottom. In FIG. 8, even after 180° C.-1 hr annealing and MIT test, the inventive thermally stable layer structure below dotted line A is still present and easily differentiated by the characteristic fine grain appearance from the base foil's large grain shown in the part above line A. On the other hand, a MIT-failed non-annealed specimen of comparative example 1 experienced very pronounced re-crystallization with an enlargement of grain size in the ruptured

TABLE 1

| | THICKNESS | TENSILE STRENGTH (Ksi) | | THERMAL STABILITY | MIT-Nf (folds) | | IPC-DF (%) | | |
|---|---|---|---|---|---|---|---|---|---|
| | OZ | EA | EH3 | % | EA | EH3 | EA | EH3 | REMARKS |
| Example 1 | H | 59.5 | 52.6 | 11.6 | 421 | 460 | 98.2 | 107.2 | 16 + 2 |
| Comparative Example 1 | H | 57.8 | 50.6 | 12.5 | 212 | 238 | 59.9 | 74.9 | 18 + 0 |
| Comparative Example 2 | H | 55.2 | 36.1 | 34.6 | 258 | 226 | 50 | 96 | ED-SHTE |
| Comparative Example 3 | H | 59.2 | 20.1 | 66.0 | 667 | 112 | 181 | 73 | RA1-P |
| Comparative Example 4 | H | 39.5 | 27.5 | 30.4 | 157 | 161 | 97 | 89 | RA2-P | region, and a totally different appearance from the columnar grain structure shown beyond the ruptured region could easily be identified. Accordingly, the thermally stable layer 110 of this invention is the main reason why the new copper foil structure can enhance the flex performance of copper foil.

Although this invention has been shown and described particularly with reference to the preferred specific embodiments and examples, it is anticipated that alterations and modifications thereof will no doubt become apparent to those skilled in the art. It is therefore intended that the following claims be interpreted as covering all such alterations and modifications as fall within the true spirit and scope of the present invention.

What is claimed is:

1. A flexible copper foil structure, comprising:
   a copper base foil having a matte side and shiny side; and
   a first copper coating layer with grain size of 2 μm or less acting as a thermally stable layer overlying the matte side of the copper base foil.

2. The structure as claimed in claim 1, further comprising a second copper coating layer with grain size of 2 μm or less overlying the shiny side of the copper base foil.

3. The structure as claimed in claim 1, wherein the thermally stable layer is a copper coating layer with less degradation in tensile strength resulting from heat treatment than than of the copper base foil.

4. The structure as claimed in claim 3, wherein the thermally stable layer is with alloy elements incorporated.

5. The structure as claimed in claim 1, further comprising:
   a nodulation layer overlying the thermally stable layer;
   a barrier layer overlying the nodulation layer;
   an anti-oxidation layer overlying the barrier layer; and
   an adhesion-promotion layer overlying the anti-oxidation layer.

6. The structure as claimed in claim 1, wherein the copper base foil is an electrolytic foil or rolled foil.

7. A fabrication method of an enhanced flexible copper foil structure, comprising:
   providing a copper base foil having a matte side and shiny side; and
   forming a first copper coating layer with grain size of 2 μm or less acting as a thermally stable layer overlying the matte side of the copper base foil.

8. The method as claimed in claim 7, further comprising forming a second copper coating layer with grain size of 2 μm or less overlying the shiny side of the copper base foil.

9. The method as claimed in claim 7, wherein the thermally stable layer is formed by bright copper electroplating or pulse electroplating, or other physical or chemical methods sufficient to form a copper coating layer with less degradation in tensile strength resulting from heat treatment than that of the cooper base foil.

10. The method as claimed in claim 7, wherein the thermally stable layer is a copper coating layer with less degradation in tensile strength resulting from heat treatment than that of the copper base foil.

11. The method as claimed in claim 10, wherein the thermally stable layer is with alloy elements incorporated.

12. The method as claimed in claim 7, further comprising:
    forming a nodulation layer overlying the thermally stable layer;
    forming a barrier layer overlying the nodulation layer;
    forming an anti-oxidation layer overlying the barrier layer; and
    forming a adhesion-promotion layer overlying the anti-oxidation layer.

13. The method as claimed in claim 7, wherein the copper base foil is an electrolytic foil or rolled foil.

* * * * *

UNITED STATES PATENT AND TRADEMARK OFFICE
CERTIFICATE OF CORRECTION

PATENT NO. : 7,052,781 B2  Page 1 of 1
APPLICATION NO. : 10/843032
DATED : May 30, 2006
INVENTOR(S) : Yu-Chung Chen et al.

It is certified that error appears in the above-identified patent and that said Letters Patent is hereby corrected as shown below:

On the front page of the patent:

item (75) - delete the inventor name "Hong-Kuen Lee, Hsinchu (KR)" and replace with --Hung-Kun Lee, Hsinchu (TW)--

Signed and Sealed this

Sixth Day of February, 2007

JON W. DUDAS
*Director of the United States Patent and Trademark Office*